(12) United States Patent
Jeon et al.

(10) Patent No.: US 7,271,629 B2
(45) Date of Patent: Sep. 18, 2007

(54) BUFFER CIRCUIT HAVING ELECTROSTATIC DISCHARGE PROTECTION

(75) Inventors: Chanhee Jeon, Suwon-Si (KR);
Bongjae Kwon, Yongin-Si (KR);
Eunkyoung Kwon, Suwon-Si (KR)

(73) Assignee: Samsung Electronics Co, Ltd, Gyeonggi-Do (KR)

( * ) Notice: Subject to any disclaimer, the term of this patent is extended or adjusted under 35 U.S.C. 154(b) by 46 days.

(21) Appl. No.: 10/986,771

(22) Filed: Nov. 15, 2004

(65) Prior Publication Data
US 2005/0174142 A1    Aug. 11, 2005

(30) Foreign Application Priority Data
Feb. 7, 2004    (KR) ...................... 10-2004-0008147

(51) Int. Cl.
*H02H 3/22*    (2006.01)
*H02H 9/04*    (2006.01)

(52) U.S. Cl. ...................... 327/112; 327/437; 327/576; 361/56

(58) Field of Classification Search ..................... None
See application file for complete search history.

(56) References Cited

U.S. PATENT DOCUMENTS

| 5,793,588 | A * | 8/1998 | Jeong .......................... 361/56 |
| 6,300,800 | B1* | 10/2001 | Schmitt et al. ............... 326/86 |
| 6,327,126 | B1* | 12/2001 | Miller et al. ................. 361/56 |
| 6,552,583 | B1* | 4/2003 | Kwong ....................... 327/112 |
| 2006/0189189 | A1* | 8/2006 | Jeon ........................... 439/248 |

* cited by examiner

*Primary Examiner*—Quan Tra
*Assistant Examiner*—Terry L. Englund
(74) *Attorney, Agent, or Firm*—Harness, Dickey & Pierce, P.L.C.

(57) ABSTRACT

The buffer circuit includes pull up and pull down circuits configured to selectively pull up and pull down, respectively, a voltage of an put/output pad. The pull up and pull down circuits are connected to separate power supply lines such that a current path from the input/output pad to the pull down circuit through the pull up circuit does not exist when electrostatic discharge is received at the input/output pad.

17 Claims, 10 Drawing Sheets

BUFFER CIRCUIT HAVING ELECTROSTATIC DISCHARGE PROTECTION

CROSS-REFERENCE TO RELATED APPLICATIONS

This U.S. non-provisional patent application claims priority under 35 U.S.C. § 119 of Korean Patent Application P2004-0008147 filed on Feb. 7, 2004, the entire contents of which are hereby incorporated by reference.

BACKGROUND OF THE INVENTION

Exposure to large and sudden electrostatic discharge (ESD) is a well-known cause of failure for electronic integrated circuits. The discharge may cause significant damage to the integrated circuit by way of dielectric breakdown of oxides and other thin films and by high levels of conduction through relatively small areas of the circuit arising from reverse breakdown of p-n junctions in the circuit. This is particularly true of circuit portions such as buffer circuits, which are connected to power supplies and receive various voltages during operation.

FIG. 1 illustrates a prior art output buffer circuit, which includes ESD protection, of an integrated circuit. As shown, an input/output pad IOPAD1 is connected between a pull up circuit UP1 and a pull down circuit DOWN1 of an output buffer circuit 2. The input/output pad IOPAD1 is also connected to internal logic or other internal circuitry of the integrated circuit via a first resistor R1 of the output buffer circuit 2 and an input buffer circuit 4. The output buffer circuit 2 receives a signal to be supplied to the input/output pad IOPAD1 from the input buffer circuit 4.

The pull up circuit UP1 and the pull down circuit DOWN1 are connected in series between a power supply line 6 and a ground line 8. The power supply line 6 supplies a power supply voltage VDD received via a power supply pad VDDPAD. The ground line 8 is connected to a ground pad VSSPAD for providing a ground voltage VSS. The pull up circuit UP1 includes a PMOS transistor MP1 connected between the power supply line 6 and the pull down circuit DOWN1. The bulk of the PMOS transistor MP1 is also connected to the power supply line 6, and a gate of the PMOS transistor MP1 receives a pre-drive signal from a pre-charge driver circuit (not shown).

The pull down circuit DOWN1 includes first and second NMOS transistors MN1 and MN2 connected in series between the pull up circuit UP1 and the ground voltage line 8. The bulks of the first and second NMOS transistors MN1 and MN2 are connected to the ground line 8. The gate of the first NMOS transistor MN1 is connected to the power supply line 6 via a second resistor R2, and the gate of the second NMOS transistor MN2 receives the pre-drive signal from the pre-charge driver circuit.

During normal operation, when the pre-drive signal is a logic high voltage, the second NMOS transistor MN2 turns on and the PMOS transistor MP1 turns off. As a result, the pull down circuit DOWN1 conducts and pulls the input/output pad IOPAD1 down to the ground voltage VSS. When the pre-drive signal is a logic low voltage, the second NMOS transistor MN2 turns off and the PMOS transistor MP1 turns on. As a result, the pull up circuit UP1 conducts and pulls the input/output pad IOPAD1 up to the power supply voltage VDD.

During an ESD event, when ESD is received at the input/output pad IOPAD1, for example, the output buffer circuit 2 protects the integrated circuit by passing large current to the ground line 8 using parasitic bipolar transistors formed by the pull down circuit DOWN1. FIG. 2 illustrates a cross sectional view of a semiconductor substrate 12 in which the output buffer circuit 2 of FIG. 1 is formed. FIG. 2 illustrates the doped source and drain regions P1+, P2+, N1+, N2+, and N3+ of the PMOS transistor MP1 and the first and second NMOS transistors MN1 and MN2. More specifically, FIG. 2 shows the parasitic bipolar transistors formed by the pull down circuit DOWN 1. As shown, the three parasitic lateral npn bipolar transistors NPN1, NPN2 and NPN3 are formed from the n+ source/drains N1+, N2+ and N3+ of the first and second NMOS transistors MN1 and MN2 and the P-well in which the first and second NMOS transistors MN1 and MN2 are formed.

A large ESD current involves avalanche breakdown, or first breakdown, where the parasitic bipolar transistors NPN1, NPN2 and NPN3 turn on and conduct the ESD current to the ground line VSS. FIG. 3 illustrates a voltage versus current graph in which this first break down occurs at voltage Vt1 and current It1. The hole current generated from the avalanche breakdown, drifting through the effective substrate resistance R4 to the ground line 8, may elevate the substrate potential local to the emitter-base junctions of the parasitic bipolar transistors NPN1, NPN2 and NPN3. The emitter-base junctions of the parasitic bipolar transistors NPN1, NPN2 and NPN3 may then begin to weakly forward bias due to the increase of the local substrate potential. The additional electron current through the parasitic bipolar transistors NPN1, NPN2 and NPN3 acts as seed current to drive a significant increase at the collector-base junction of the parasitic bipolar transistors NPN1, NPN2 and NPN3. This is commonly referred to as a snap back mechanism, and FIG. 3 illustrates this snap back taking place at a snap back voltage Vsp.

At high stress levels, the circuit may then go into thermal or second break down—shown at voltage Vt2 and current It2 in FIG. 3. Here, the device temperature has increased to such a level that thermal carrier generation is high enough to dominate the conduction process. This second breakdown is a positive feedback process that causes device failure because of current localization. Commonly, the current level at which an integrated circuit device undergoes second breakdown is used as a predictor of the device's current handling capabilities under ESD events.

Under the ESD stress condition, the large ESD at the input/output pad IOPAD1 may be transmitted to the gate of the first NMOS transistor MN1 through a current path formed by the PMOS transistor MP1 and the voltage supply line 6. This may turn on the first NMOS transistor MN 1, which forms a channel between the source and drain N1+ and N2+ of the first NMOS transistor MN1. Current crowds into this channel instead of flowing through the parasitic bipolar transistors NPN1, NPN2, and NPN3. When the lattice temperature at the edge of the channel becomes high, early device failure occurs due to the gate voltage induced current crowding (GVICC) phenomenon.

SUMMARY OF THE INVENTION

The present invention provides an output buffer circuit having a pull up circuit and a pull down circuit configured to selectively pull up and pull down, respectively, a voltage of an input/output pad. The pull up and pull down circuits are connected to separate power supply lines such that a current path from the input/output pad to the pull down circuit through the pull up circuit does not exist when electrostatic discharge is received at the input/output pad.

In one embodiment, the pull down circuit forms an electro-static discharge circuit for discharging electrostatic current received at the input/output pad.

In an embodiment, the pull up circuit includes a PMOS transistor connected between the input/output pad and a first power supply line. A gate of the PMOS transistor receives a driver signal. The pull down circuit includes first and second NMOS transistors connected in series between the input/output pad and a low potential reference line. A gate of the first NMOS transistor is connected to a second power supply line, and a gate of the second NMOS transistor receives the driver signal. Here, the pull down circuit forms at least one parasitic bipolar transistor when an electro-static current is received at the input/output pad to discharge the electro-static current.

In another embodiment, the buffer circuit also includes an isolation circuit configured to isolate the input/output pad from the power supply line to which the pull up circuit is connected.

Another embodiment includes a pull up circuit selectively connecting an input/output pad to a first power supply line, and a pull down circuit selectively connecting the input/output pad to a low potential reference line. The pull down circuit forms the electro-static discharge circuit for discharging electrostatic current at the input/output pad to the low potential reference line, and the pull down circuit includes active elements at least one of which is connected to a second power supply line.

In a further exemplary embodiment, the buffer circuit includes at least first and second circuit blocks. The first circuit block includes a first pull up circuit and a first pull down circuit configured to selectively pull up and pull down, respectively, a voltage of a first input/output pad, and the first pull up and pull down circuits are connected to first and second power supply lines, respectively. The second circuit block includes third and fourth power lines, and the fourth power line is connected to the second power line.

In one embodiment, the second power supply line is connected to a power supply pad of the second circuit block.

In another embodiment, the second circuit block further includes a second pull up circuit and a second pull down circuit configured to selectively pull up and pull down, respectively, a voltage of a second input/output pad, and the second pull up and pull down circuits are connected to the third and fourth power supply lines, respectively.

A still further embodiment additionally includes a third circuit block. The third circuit block includes third pull up and pull down circuits configured to selectively pull up and pull down, respectively, a voltage of a third input/output pad. The third pull up and pull down circuits are connected to fifth and sixth power supply lines, respectively.

In one embodiment, the sixth power supply line is connected to the third power supply line.

In yet another embodiment of the present invention, the buffer circuit includes a number of circuit blocks. Each circuit block includes pull up and pull down circuits configured to selectively pull up and pull down, respectively, a voltage of an associated input/output pad. Each of the pull up and pull down circuit pairs are connected to separate power supply lines such that a current path from the associated input/output pad to the pull down circuit through the pull up circuit does not exist when electrostatic discharge is received at the input/output pad.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EMBODIMENTS

Figure 4:
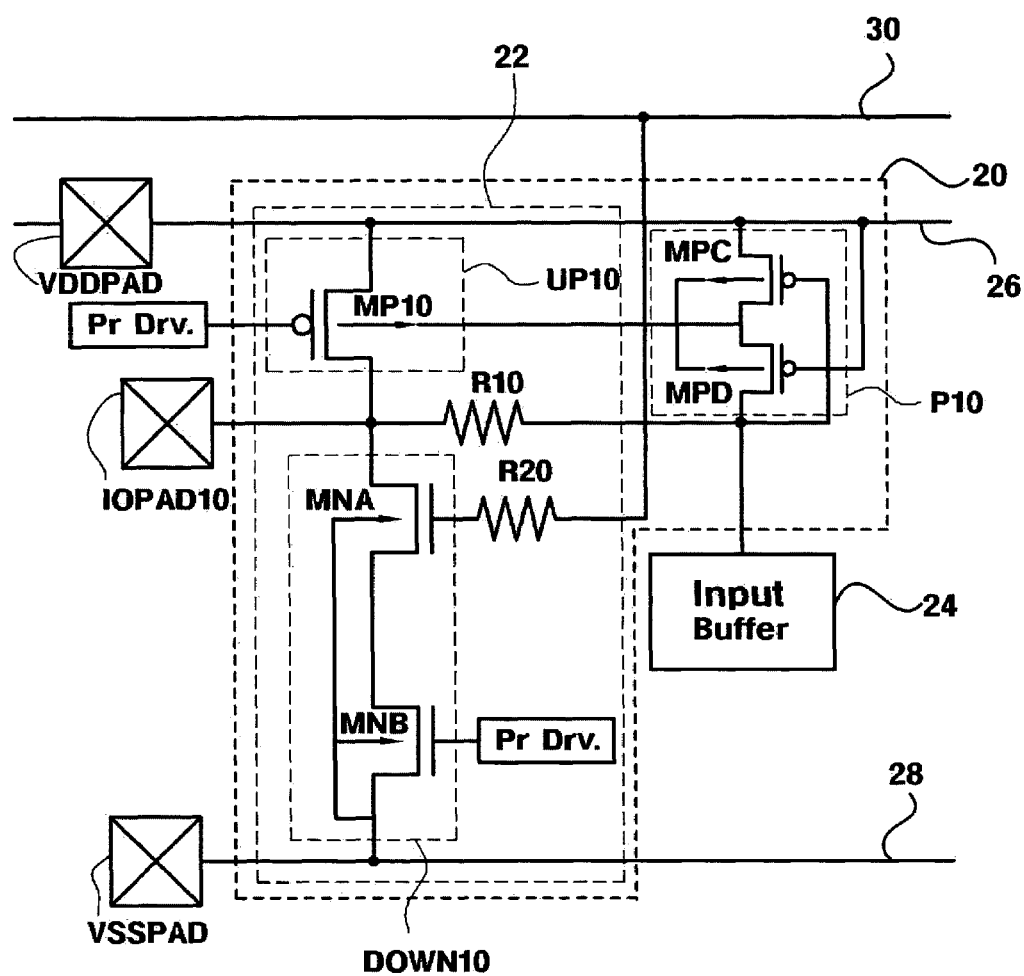
FIG. 4 illustrates an embodiment of an output buffer circuit, which includes ESD protection, of an integrated circuit according to the present invention.

FIG. 4 illustrates an embodiment of an output buffer circuit, which includes electrostatic discharge (ESD) protection, of an integrated circuit according to the present invention. As shown, an input/output pad IOPAD10 is connected between a pull up circuit UP10 and a pull down circuit DOWN10 of an output buffer circuit 22. The input/output pad IOPAD10 is also connected to internal logic or other internal circuitry of the integrated circuit via a first resistor R10 of the output buffer circuit 22 and an input buffer circuit 24. The output buffer circuit 22 receives a signal to be supplied to the input/output pad IOPAD10 from the input buffer circuit 24.

The pull up circuit UP10 and the pull down circuit DOWN10 are connected in series between a first power supply line 26 and a ground line 28. The first power supply line 26 supplies a power supply voltage VDDO received via a power supply pad VDDPAD. The ground line 28 is connected to a ground pad VSSPAD for providing a ground voltage VSS. The pull up circuit UP10 includes a PMOS transistor MP10 connected between the first power supply line 26 and the pull down circuit DOWN10. The bulk of the PMOS transistor MP10 may be connected to the first power supply line 26, or optionally, as shown in FIG. 4, may be connected to an isolation circuit P10. A gate of the PMOS transistor MP10 receives a pre-drive signal from a pre-charge driver circuit (not shown).

The isolation circuit P10 electrically isolates the first power supply line 26 from the input/output pad IOPAD10. The isolation circuit P10 includes a second PMOS transistor MPC and a third PMOS transistor MPD connected in series between the first resistor R10 and the first power supply line 26. The bulks of the second and third PMOS transistors MPC and MPD are connected. The gate of the second PMOS transistor MPC is connected to the first resistor R10 and the gate of the third PMOS transistor MPD is connected to the first power supply line 26.

The pull down circuit DOWN10 includes first and second NMOS transistors MNA and MNB connected in series between the pull up circuit UP10 and the ground voltage line 28. The bulks of the first and second NMOS transistors MNA and MNB are connected to the ground line 28. The gate of the first NMOS transistor MNA is connected to a second power supply line 30 via a second resistor R20. The second power supply line 30 carries a second power supply voltage VDD-TOL, and is electrically isolated from the first power supply line 26. The gate of the second NMOS transistor MNB receives the pre-drive signal from the pre-charge driver circuit. The second resistor R20 and the first resistor R10 may be a wire resistance, a poly resistance, diffusion resistance, etc.

For ease of describing subsequent embodiments, the output buffer circuit 22 and isolation circuit P10 will be collectively referred to as an output buffer circuit block 20.

During normal operation, when the pre-drive signal is a logic high voltage, the second NMOS transistor MNB turns on and the PMOS transistor MP10 turns off. As a result, the pull down circuit DOWN10 conducts and pulls the input/output pad IOPAD10 down to the ground voltage VSS. When the pre-drive signal is a logic low voltage, the second NMOS transistor MNB turns off and the PMOS transistor MP10 turns on. As a result, the pull up circuit UP10 conducts and pulls the input/output pad IOPAD10 up to the power supply voltage VDD.

Figure 5:
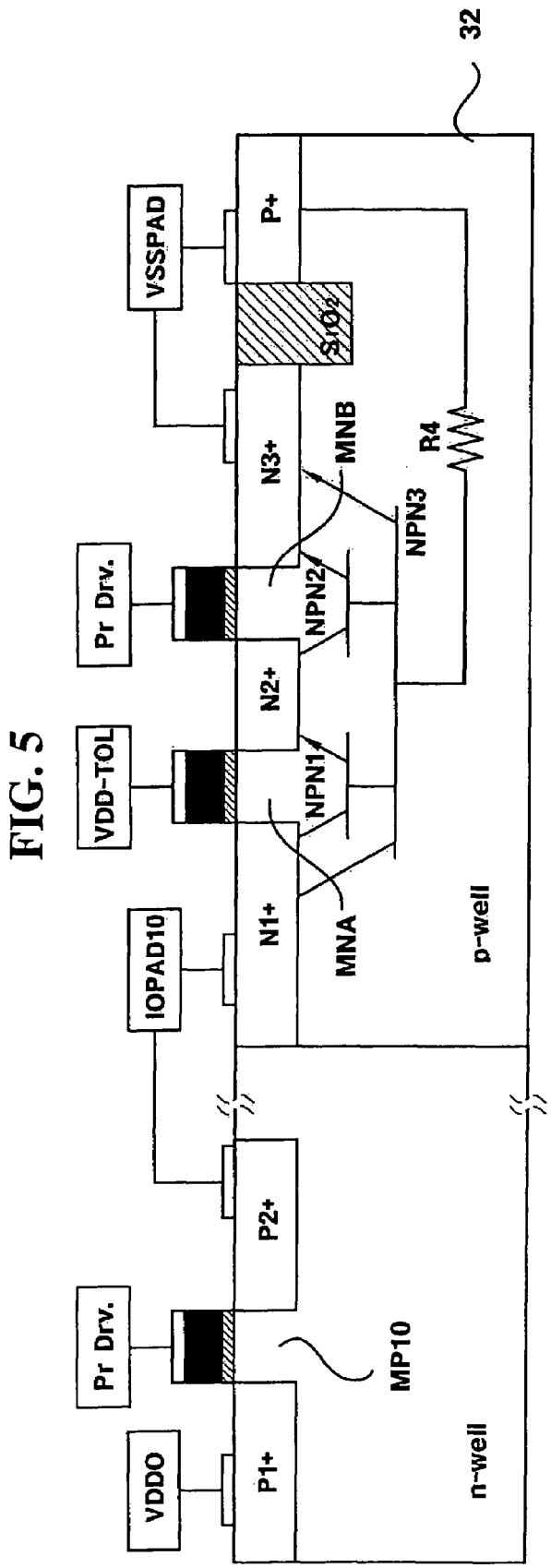
FIG. 5 illustrates a cross sectional view of a semiconductor substrate in which the output buffer circuit of FIG. 4 is formed.

During an ESD event, when ESD is received at the input/output pad IOPAD10, for example, the output buffer circuit 22 protects the integrated circuit by passing large current to the ground line 28 using parasitic bipolar transistors formed by the pull down circuit DOWN 10. FIG. 5 illustrates a cross sectional view of a semiconductor substrate 32 in which the output buffer circuit 22 of FIG. 5 is formed. FIG. 5 illustrates the doped source and drain regions P1+, P2+, N1+, N2+, and N3+ of the PMOS transistor MP10 and the first and second NMOS transistors MNA and MNB. More specifically, FIG. 5 shows the parasitic bipolar transistors formed by the pull down circuit DOWN10. As shown, the three parasitic lateral npn bipolar transistors NPN1, NPN2 and NPN3 are formed from the n+ source/drains N1+, N2+ and N3+ of the first and second NMOS transistors MNA and MNB and the P-well in which the first and second NMOS transistors MNA and MNB are formed.

A large ESD current involves avalanche breakdown, or first breakdown, where the parasitic bipolar transistors NPN1, NPN2 and NPN3 turn on and conduct the ESD current to the ground line VSS.

Under the ESD stress condition, the large ESD at the input/output pad IOPAD10 is not transmitted to the gate of the first NMOS transistor MNA through the PMOS transistor MP10 and the voltage supply line 26 because the gate of the first NMOS transistor MNA is connected to the second voltage supply line 30. Namely, a current path from the input/output pad IOPAD10 to the gate of the first NMOS transistor MNA of the pull down circuit DOWN10 does not exist when the ESD is received; and accordingly, the parasitic bipolar transistors NPN1, NPN2 and NPN3 adequately flow large current to the ground line 28 and protect the integrated circuit. As such, this embodiment of the present invention reduces the chances of early device failure occurring due to the gate voltage induced current crowding (GVICC) phenomenon.

Figure 1:
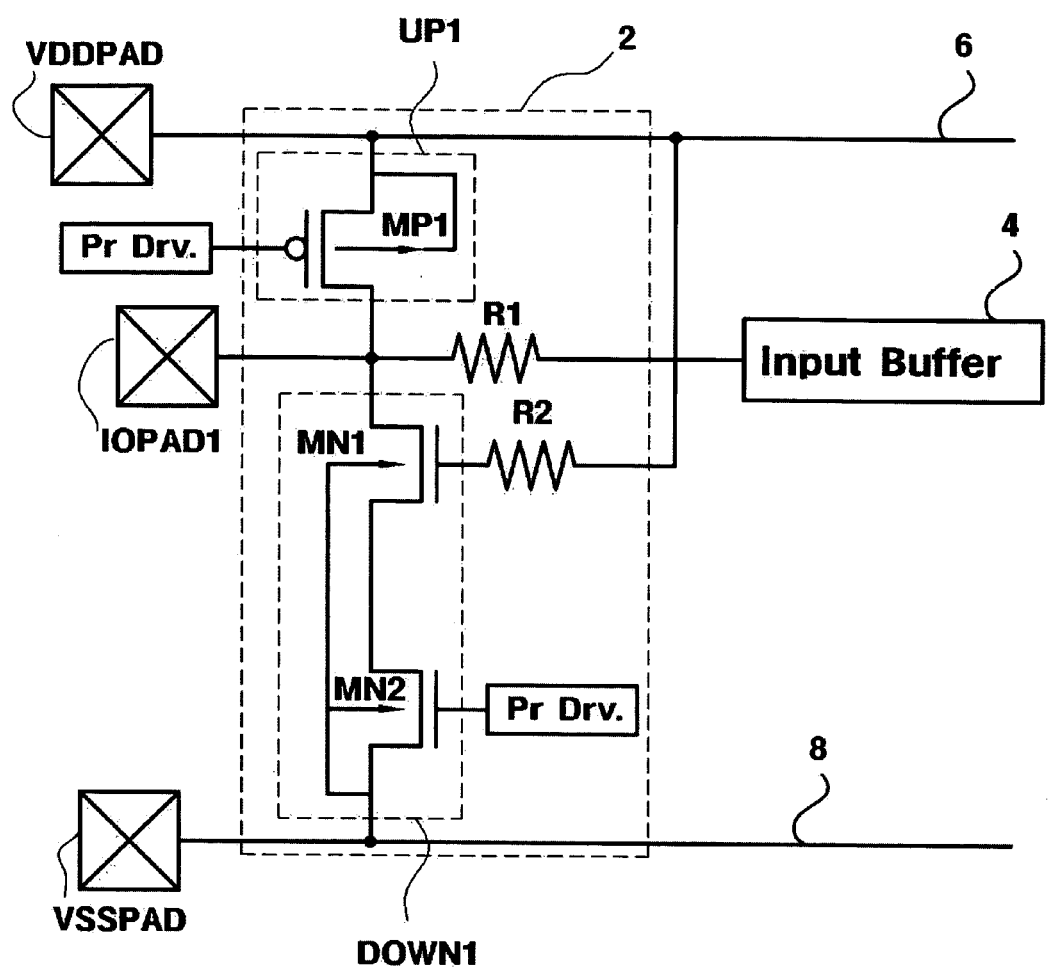
FIG. 1 illustrates a prior art output buffer circuit, which includes electrostatic discharge (ESD) protection, of an integrated circuit.
Figure 2:
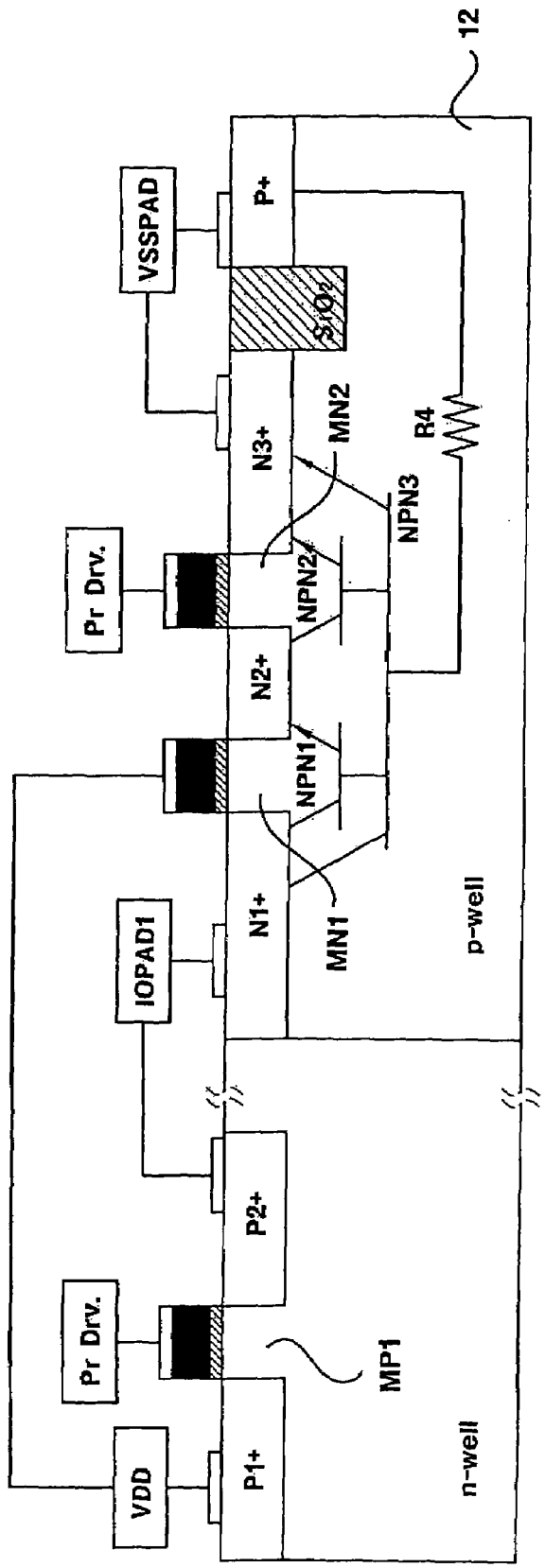
FIG. 2 illustrates a cross sectional view of a semiconductor substrate in which the output buffer circuit of FIG. 1 is formed.
Figure 3:
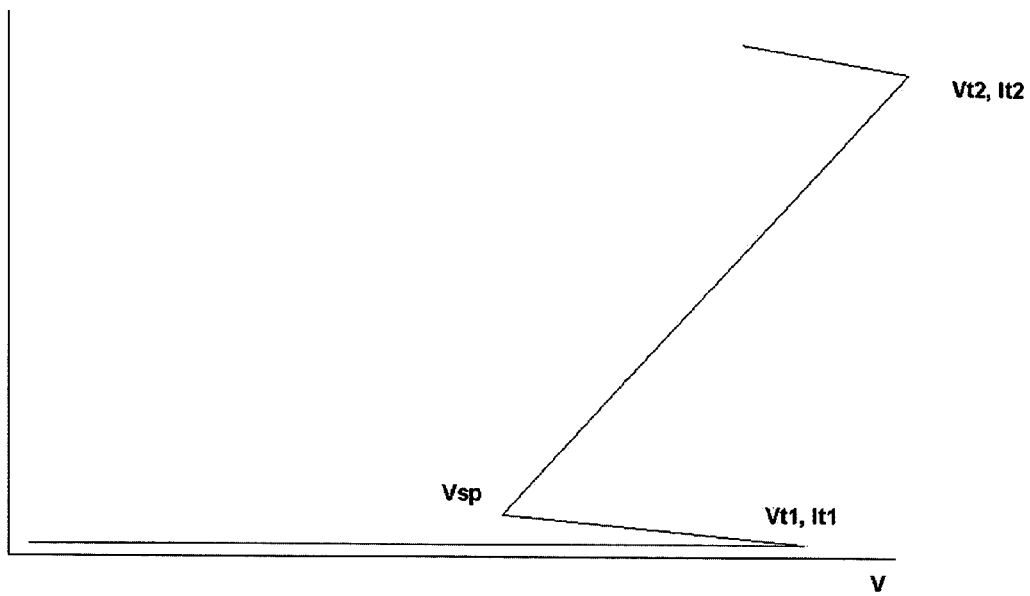
FIG. 3 illustrates a voltage versus current graph for the circuit of FIG. 1.
Figure 6:
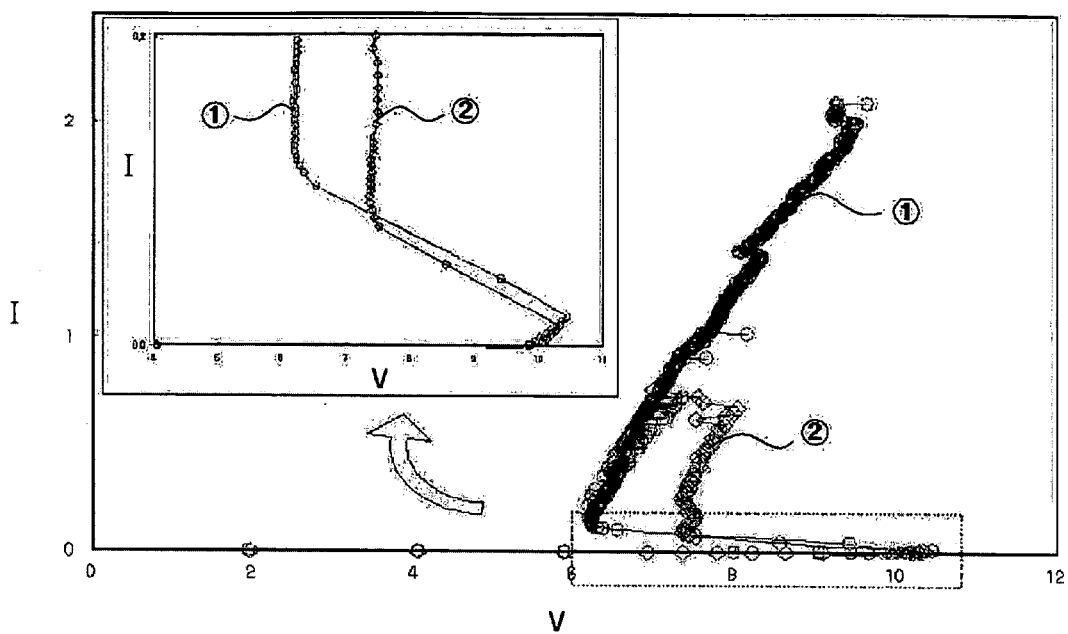
FIG. 6 illustrates a voltage versus current graph similar to FIG. 3 in which the curve shown in FIG. 3 for the prior art is labeled curve 2 and the curve for the embodiment of FIG. 4 is labeled curve 1.

FIG. 6 illustrates a voltage versus current graph similar to FIG. 3 in which the curve shown in FIG. 3 for the prior art is labeled curve 2 and the curve for the embodiment of FIG. 4 is labeled curve 1. As shown, the embodiment of the present invention shown in FIG. 4 provides for a much greater current flow.

Next operation of the optional isolation circuit P10 will be described. As mentioned above, the isolation circuit P10 isolates the input/output pad IOPAD10 from the voltage supply line 26. Whenever an output signal has a higher voltage level than the power supply voltage VDDO, the second PMOS transistor MPC turns off. And, whenever the output signal has a lower voltage level than the power supply voltage VDDO, the third PMOS transistor MPD turns off. As such, the output voltage transmitted to the input/output pad IOPAD10 remain unaffected by the power supply voltage VDDO.

Figure 7:
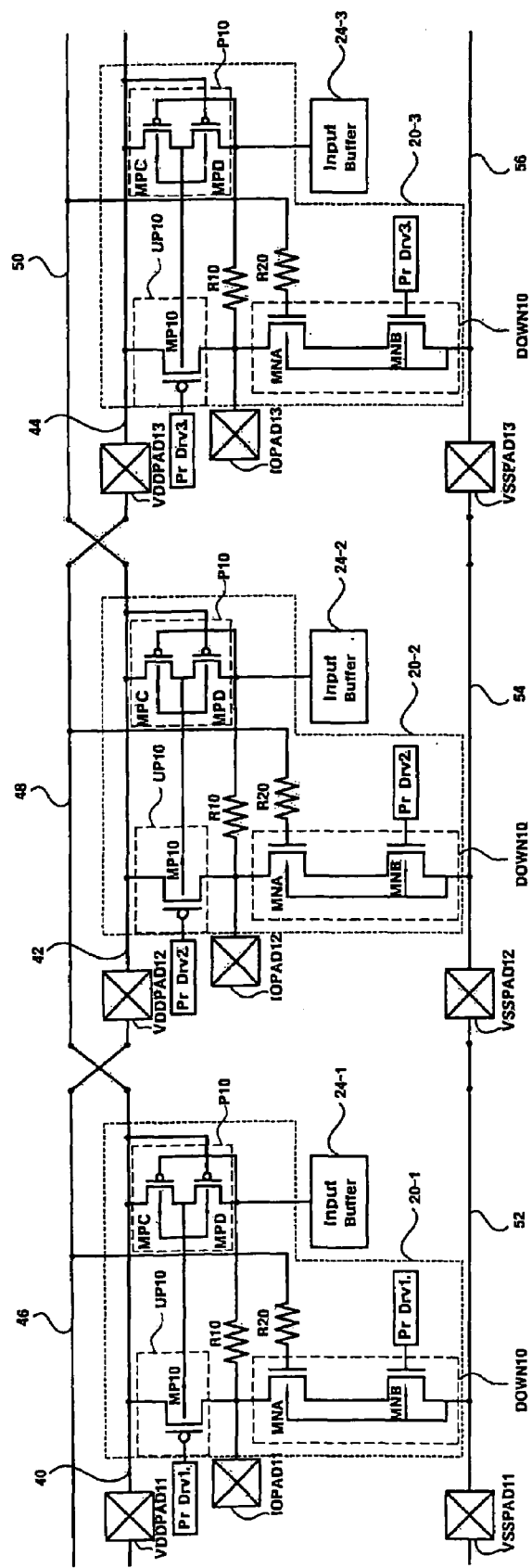

Next, a second embodiment of the present invention will be described with reference to FIG. 7, which illustrates an array of output buffer circuits. FIG. 7 illustrates first, second and third power supply lines 40, 42 and 44 supplying first, second and third power supply voltages VDDO1, VDDO2 and VDDO3, respectively. The first, second and third power supply lines 40, 42 and 44 are connected to first, second and third power supply pads VDDPAD11, VDDPAD12 and VDDPAD13, respectively.

FIG. 7 further illustrates fourth, fifth and sixth power supply lines 46, 48 and 50 supplying fourth, fifth and sixth power supply voltages VDD-TOL1, VDD-TOL2 and VDD-TOL3, respectively. The fourth, fifth and sixth power supply lines 46, 48 and 50 are respectively, electrically isolated from the first, second and third power supply lines 40, 42 and 44. The fourth power supply line 46 is connected to the second power supply pad VDDPAD12. The fifth power supply line 48 is connected to the first power supply line 40 and the third power supply pad VDDPAD13. The sixth power supply line 50 is connected to the second power supply line 42.

Also, first, second and third ground lines 52, 54 and 56 are connected to first, second and third ground pads VSSPAD11, VSSPAD12 and VSSPAD13, respectively. The first ground line 52 is also connected to the second ground pad VSSPAD12, and the second ground line 54 is also connected to the third ground pad VSSPAD13.

FIG. 7 illustrates first, second and third output buffer circuit blocks 20-1, 20-2 and 20-3, each having the same structure as the output buffer circuit block 20 of FIG. 4. The first, second and third output buffer circuit blocks 20-1, 20-2 and 20-3 differ in their respective connection to the power supply lines, respective connection to the ground lines, respective pre-drive signal received, and respective connection to the input buffer circuits 24-1, 24-2 and 24-3.

Specifically, the sources of the first and second PMOS transistors MP10 and MPC and the gate of the third PMOS transistor MPD in the first output buffer circuit block 20-1 are connected to the first power supply line 40. The gate of the first NMOS transistor MNA is connected to the fourth power supply line 46, and the second NMOS transistor MNB is connected to the first ground line 52. The sources of the first and second PMOS transistors MP10 and MPC and the gate of the third PMOS transistor MPD in the second output buffer circuit block 20-2 are connected to the second power supply line 42. The gate of the first NMOS transistor MNA is connected to the fifth power supply line 48, and the second NMOS transistor MNB is connected to the second ground line 54. The sources of the first and second PMOS transistors MP10 and MPC and the gate of the third PMOS transistor MPD in the third output buffer circuit block 20-3 are connected to the third power supply line 44. The gate of the first NMOS transistor MNA is connected to the sixth power supply line 50, and the second NMOS transistor MNB is connected to the third ground line 56.

The operation of this embodiment with respect to each of the output buffer circuit blocks 20-1, 20-2 and 20-3 is the same as discussed above with respect to FIG. 4, and therefore, will not be repeated for the sake of brevity.

Accordingly, FIG. 7 illustrates that a number of output buffer circuits according to the present invention may be arrayed in an integrated circuit device. Furthermore, while FIG. 7 illustrates an array of three output buffer circuits, it will be appreciated that a number greater or less than three may constitute an array by following the pattern provided in FIG. 7.

Furthermore, in an alternative embodiment, the input/output pad IOPAD12 of the second output buffer circuit block 20-2 may be eliminated. In this embodiment then, there is no need for an ESD protection circuit, and the second power supply pad VDDPAD12 may be eliminated. Namely, the second power supply line 42 is connected to the fourth power supply line 46.

In yet a further alternative embodiment, for example, the first and third power supply pads VDDPAD11 and VDDPAD13 may be merged into a single pad.

Figure 8:
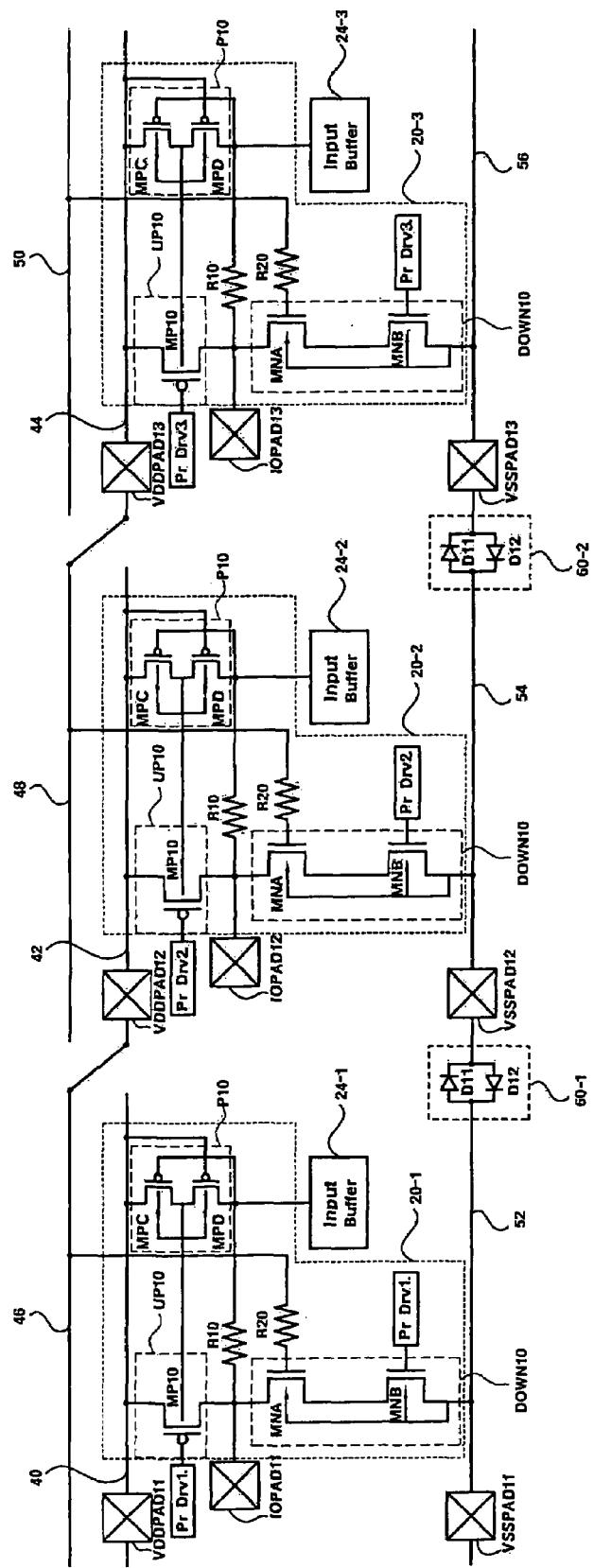
FIGS. 8-10 illustrate embodiments of an array of output buffer circuits according to the present invention.

FIG. 8 illustrates another embodiment of an output buffer circuit array according to the present invention. The embodiment of FIG. 8 is the same as the embodiment of FIG. 7 except that: 1) the fifth power supply line 48 is electrically isolated from the first power supply line 40) the sixth power supply line 50 is electrically isolated from the second power supply line 42) a first isolating circuit 60-1 is disposed between the first ground line 52 and the second ground pad VSSPAD12, and 4) a second isolating circuit 60-2 is disposed between the second ground line 54 and the third ground pad VSSPAD13.

The first and second isolating circuits 60-1 and 60-2 have the same structure of first and second diodes D11 and D12 connected anode to cathode.

Except for the additional electrical isolation mentioned above, the operating characteristics of the embodiment of FIG. 8 remain the same as that of the embodiment of FIG. 7, and therefore, will not be repeated for the sake of brevity. Furthermore, the options and alternative embodiment discussed above with respect to the embodiment of FIG. 7 are also applicable to the embodiment of FIG. 8 and will not be repeated for the sake of brevity.

Figure 9:
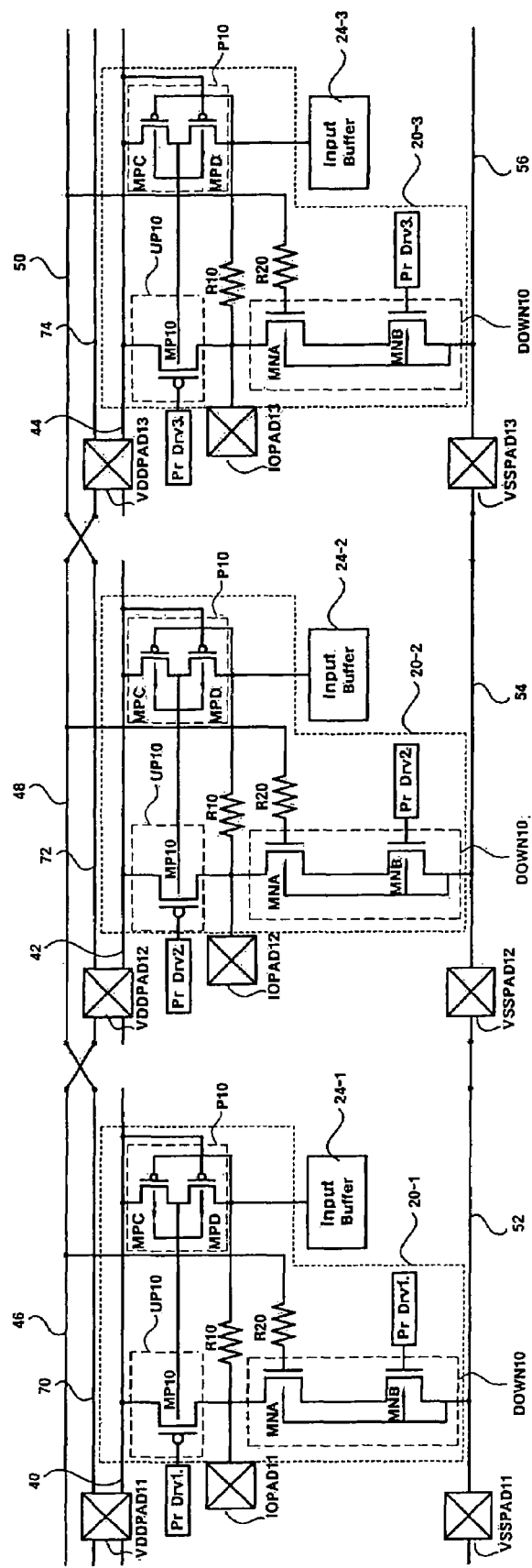

FIG. 9 illustrates another embodiment of an output buffer circuit array according to the present invention. This embodiment illustrates that the array may include a plurality of power supply lines. While this embodiment does include a specific number of power supply lines, it will be appreciated from this and the preceding embodiments, that the present invention is not limited this number.

As shown, the array includes first, second and third power supply lines 40, 42 and 44 supplying first, second and third power supply voltages VDDO1, VDDO2 and VDDO3, respectively. The first, second and third power supply lines VDDO1, VDDO2 and VDDO3 are connected to first, second and third power supply pads VDDPAD11, VDDPAD12 and VDDPAD13, respectively. The array further includes fourth, fifth and sixth power supply lines 46, 48 and 50 supplying fourth, fifth and sixth power supply voltages VDD-TOL1, VDD-TOL2 and VDD-TOL3, respectively. The fourth, fifth and sixth power supply lines 46, 48 and 50 are respectively, electrically isolated from the first, second and third power supply lines 40, 42 and 44.

FIG. 9 further illustrates that the array includes seventh, eighth and ninth power supply lines 70, 72 and 74 supplying seventh, eighth and ninth power supply voltages VDDP1, VDDP2 and VDDP3, respectively, and connected to the first, second and third power supply pads VDDPAD11, VDDPAD12 and VDDPAD13, respectively. The seventh, eighth and ninth power supply lines 70, 72 and 74 are respectively, electrically isolated from the fourth, fifth and sixth power supply lines 46, 48 and 50. The fourth power supply line 46 is connected to the second power supply pad VDDPAD12. The fifth power supply line 48 is connected to the seventh power supply line 70 and the third power supply pad VDDPAD13. The sixth power supply line 50 is connected to the eighth power supply line 72.

Also, first, second and third ground lines 52, 54 and 56 are connected to first, second and third ground pads VSSPAD11, VSSPAD12 and VSSPAD13, respectively. The first ground line 52 is also connected to the second ground pad VSSPAD12, and the second ground line 54 is also connected to the third ground pad VSSPAD13.

FIG. 9 illustrates first, second and third output buffer circuit blocks 20-1, 20-2 and 20-3, each having the same structure as the output buffer circuit block 20 of FIG. 4. The first, second and third output buffer circuit blocks 20-1, 20-2 and 20-3 differ in their respective connection to the power supply lines, respective connection to the ground lines, respective pre-drive signal received, and respective connection to the input buffer circuits 24-1, 24-2 and 24-3.

Specifically, the sources of the first and second PMOS transistors MP10 and MPC and the gate of the third PMOS transistor MPD in the first output buffer circuit block 20-1 are connected to the first power supply line 40. The gate of the first NMOS transistor MNA is connected to the fourth power supply line 46, and the second NMOS transistor MNB is connected to the first ground line 52. The sources of the first and second PMOS transistors MP10 and MPC and the gate of the third PMOS transistor MPD in the second output buffer circuit block 20-2 are connected to the second power supply line 42. The gate of the first NMOS transistor MNA is connected to the fifth power supply line 48, and the second NMOS transistor MNB is connected to the second ground line 54. The sources of the first and second PMOS transistors MP10 and MPC and the gate of the third PMOS transistor MPD in the third output buffer circuit block 20-3 are connected to the third power supply line 44. The gate of the first NMOS transistor MNA is connected to the sixth power supply line 50, and the second NMOS transistor MNB is connected to the third ground line 56.

The operation of this embodiment with respect to each of the output buffer circuit blocks 20-1, 20-2 and 20-3 is the same as discussed above with respect to FIG. 4, and therefore, will not be repeated for the sake of brevity.

Accordingly, FIG. 9 illustrates that a number of output buffer circuits according to the present invention may be arrayed in an integrated circuit device. Furthermore, while FIG. 9 illustrates an array of three output buffer circuits, it will be appreciated that a number greater or less than three may constitute an array by following the pattern provided in FIG. 9.

Furthermore, in an alternative embodiment, the input/output pad IOPAD12 of the second output buffer circuit block 20-2 may be eliminated. In this embodiment then, there is no need for an ESD protection circuit, and the second power supply pad VDDPAD12 may be eliminated. Namely, the second power supply line 42 and the eighth power supply line 72 are connected to the fourth power supply line 46.

In yet a further alternative embodiment, for example, the first and third power supply pads VDDPAD11 and VDDPAD13 may be merged into a single pad.

Figure 10:
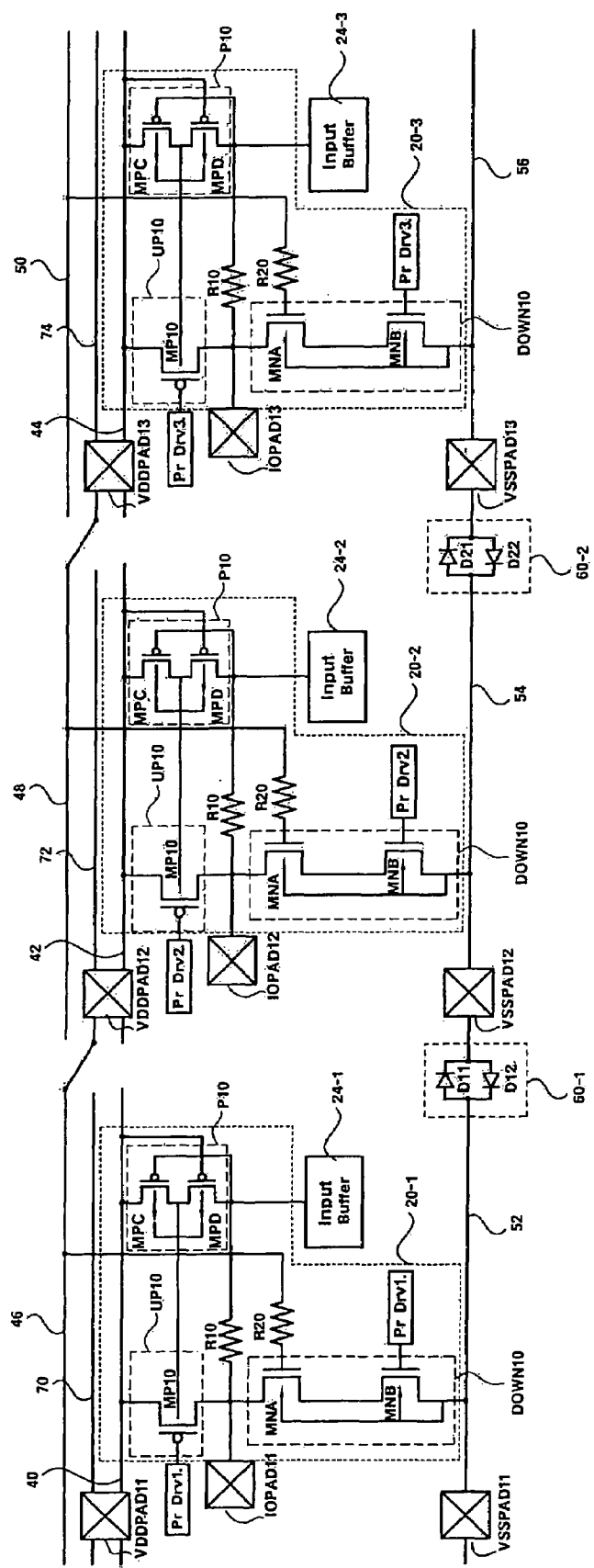

FIG. 10 illustrates another embodiment of an output buffer circuit array according to the present invention. The embodiment of FIG. 10 is the same as the embodiment of FIG. 9 except that: 1) the fifth power supply line 48 is electrically isolated from the seventh power supply line 70, 2) the sixth power supply line 50 is electrically isolated from the eighth power supply line 72, 3) a first isolating circuit 60-1 is disposed between the first ground line 52 and the second ground pad VSSPAD12, and 4) a second isolating circuit 60-2 is disposed between the second ground line 54 and the third ground pad VSSPAD 13.

The first and second isolating circuits 60-1 and 60-2 have the same structure of first and second diodes D11 and D12 connected anode to cathode.

Except for the additional electrical isolation mentioned above, the operating characteristics of the embodiment of FIG. 10 remain the same as that of the embodiment of FIG. 9, and therefore, will not be repeated for the sake of brevity. Furthermore, the options and alternative embodiments discussed above with respect to the embodiment of FIG. 9 are also applicable to the embodiment of FIG. 10 and will not be repeated for the sake of brevity.

The invention being thus described, it will be obvious that the same may be varied in many ways. Such variations are not to be regarded as a departure from the invention, and all such modifications are intended to be included within the scope of the invention.

We claim:

1. A buffer circuit, comprising:
a pull up circuit and a pull down circuit configured to selectively pull up and pull down, respectively, a voltage of an input/output pad, the pull up and pull down circuits being connected to first and second separate high potential power supply lines, respectively, such that a current path from the input/output pad to the pull down circuit through the pull up circuit does not exist when a positive electro-static discharge is received at the input/output pad; and
the pull down circuit including first and second NMOS transistors connected in series between the input/output pad and a low potential reference line, a gate of the first NMOS transistor being connected to the second high potential power supply line, and a gate of the second NMOS transistor receiving a driver signal.

2. The buffer circuit of claim 1, wherein the pull down circuit forms an electro-static discharge circuit for discharging electro-static current received at the input/output pad.

3. The buffer circuit of claim 2, wherein the electro-static discharge circuit includes at least one parasitic bipolar transistor.

4. The buffer circuit of claim 1, wherein the pull up circuit comprises:
a PMOS transistor connected between the input/output pad and the first high potential power supply line, a gate of the PMOS transistor receving the driver signal.

5. The buffer circuit of claim 1, wherein the pull down circuit forms at least one parasitic bipolar transistor when electro-static current is received at the input/output pad to discharge the electro-static current.

6. The buffer circuit of claim 1, further comprising:
an isolation circuit configured to isolate the input/output pad from the first high potential power supply line to which the pull up circuit is connected.

7. A buffer circuit, comprising:
at least first and second circuit blocks;
the first circuit block including,
a first input/output pad;
a first pull up circuit and a first pull down circuit configured to selectively pull up and pull down, respectively, a voltage of the first input/output pad, the first pull up and pull down circuits each being connected to a corresponding high potential power supply line such that a current path from the first input/output pad to the first pull down circuit through the first pull up circuit does not exist when a first positive electro-static discharge is received at the first input/output pad;
the second circuit block including,
a second input/output pad;
a second pull up circuit and a second pull down circuit configured to selectively pull up and pull down, respectively, a voltage of the second input/output pad, the second pull up and pull down circuits each being connected to a corresponding high potential power supply line such that a current path from the second input/output pad to the second pull down circuit through the second pull up circuit does not exist when a second positive electro-static discharge is received at the second input/output pad; and wherein
the second pull up circuit and the first pull down circuit are connected to a same first high potential power supply line.

8. The buffer circuit of claim 7, wherein the second pull down circuit and the first pull up circuit are connected to a same second high potential power supply line.

9. The buffer circuit of claim 7, wherein the second pull down circuit and the first pull up circuit are connected to different high potential power supply lines.

10. The buffer circuit of claim 7, wherein
the first circuit block further includes: a first isolation circuit configured to isolate the first input/output pad from the high potential power supply line to which the first pull up circuit is connected; and
the second circuit block further includes a second isolation circuit configured to isolate the second input/output pad from the first high potential power supply line to which the second pull up circuit is connected.

11. The buffer circuit of claim 8, wherein
in the first circuit block,
the first pull up circuit selectively connects the first input/output pad to the second high potential power supply line, and
the first pull down circuit selectively connects the first input/output pad to a first low potential reference line, the first pull down circuit forms a first electro-static discharge circuit for discharging electro-static current at the first input/output pad to the first low potential reference line, and the first pull down circuit includes active elements at least one of which is connected to the first high potential power supply line; and
in the second circuit block,
the second pull up circuit selectively connects the second input/output pad to the first high potential power supply line, and
the second pull down circuit selectively connects the second input/output pad to a second low potential reference line, the second pull down circuit forms a second electro-static discharge circuit for discharging electro-static current at the second input/output pad to the second low potential reference line, and the second pull down circuit includes active elements at least one of which is connected to the second high potential power supply line.

12. The buffer circuit of claim 7, wherein
in the first circuit block,
the first pull up circuit selectively connects the first input/output pad to the first high potential power supply line, and
the first pull down circuit selectively connects the first input/output pad to a first low potential reference line, the first pull down circuit forms a first electro-static discharge circuit for discharging electro-static current at the first input/output pad to the first low potential reference line, and the first pull down circuit includes active elements at least one of which is connected to a second high potential power supply line; and
in the second circuit block,
the second pull up circuit selectively connects the second input/output pad to the second high potential power supply line, and
the second pull down circuit selectively connects the second input/output pad to a second low potential reference line, the second pull down circuit forms a second electro-static discharge circuit for discharging electro-static current at the second input/output pad to the second low potential reference line, and the second pull down circuit includes active elements at least one of which is connected to a third high potential power supply line.

13. The buffer circuit of claim 12, wherein the first circuit block further comprises an isolating circuit located between the first low potential reference line and the second low potential reference line.

14. A buffer circuit, comprising:
a number of circuit blocks, each circuit block including,
an input/output pad, and
a pull up circuit and a pull down circuit configured to selectively pull up and pull down, respectively, a voltage of the input/output pad, the pull up and pull down circuits being connected to separate high potential power supply lines such that a current path from the input/output pad to the pull down circuit through the pull up circuit does not exist when a positive electro-static discharge is received at the input/output pad; and wherein
the pull up circuit of a subsequent circuit block and the pull down circuit of a preceding circuit block are connected to a same first high potential power supply line.

15. The buffer circuit of claim 14, wherein the pull down circuit of the subsequent circuit block and the pull up circuit of the preceding circuit block are connected to a same second high potential power supply line.

16. The buffer circuit of claim 14, wherein the pull down circuit of the subsequent circuit block and the pull up circuit of the preceding circuit block are connected to different high potential power supply lines.

17. A buffer circuit, comprising:
a pull up circuit and a pull down circuit configured to selectively pull up and pull down, respectively, a voltage of an input/output pad, the pull up and pull down circuits being connected to separate power supply lines such that a current path from the input/output pad to the pull down circuit through the pull up circuit does not exist when a positive electrostatic discharge is received at the input/output pad; and
an isolation circuit configured to isolate the input/output pad from the power supply line to which the pull up circuit is connected, the isolation circuit including at least one transistor having a gate connected to the input/output pad.

* * * * *